United States Patent [19]

Malhi

[11] Patent Number: 5,627,780

[45] Date of Patent: May 6, 1997

[54] TESTING A NON-VOLATILE MEMORY

[75] Inventor: Vijay Malhi, Milan, Italy

[73] Assignee: SGS-Thomson Microelectronics Limited, Bristol, United Kingdom

[21] Appl. No.: 518,919

[22] Filed: Aug. 24, 1995

[30] Foreign Application Priority Data

Aug. 26, 1994 [GB] United Kingdom .................... 9417266

[51] Int. Cl.$^6$ .................................................. G11C 7/00
[52] U.S. Cl. ............................... 365/185.09; 365/189.05; 365/189.07; 365/201; 365/230.08
[58] Field of Search ............................. 365/185.09, 201, 365/189.07, 189.05, 230.08, 189.02, 230.02; 371/21.1

[56] References Cited

U.S. PATENT DOCUMENTS

| | | | |
|---|---|---|---|
| 3,710,350 | 1/1973 | Yoshitake et al. | 340/172.5 |
| 3,961,252 | 6/1976 | Eichelberger | 324/73 |
| 3,961,254 | 6/1976 | Cavaliere et al. | 324/73 |
| 5,175,840 | 12/1992 | Sawase et al. | 365/201 |
| 5,287,326 | 2/1994 | Hirata | 365/201 |

FOREIGN PATENT DOCUMENTS 0012018  6/1980  European Pat. Off. ........ G11C 29/00

OTHER PUBLICATIONS

Standard Search Report dated Oct. 24, 1994.

*Primary Examiner*—Son T. Dinh
*Attorney, Agent, or Firm*—David M. Driscoll; James H. Morris

[57] ABSTRACT

An integrated circuit memory device has: a memory array; a set of data latches for holding data bits to be stored in the memory array; a plurality of data tracks for supplying data bits to the data latches; a set of address latches for holding address bits for addressing the memory array; a test bus; a data bit routing circuit connected to the data latches for selectively routing data bits to either the memory array or the test bus; an address bit routing circuit connected to the address latches for selectively routing address bits to either the array or the test bus; and an output circuit for outputting data bits and address bits on the test bus. In this way, data bits and address bits can be checked for accuracy against the originally supplied data bits and address bits. Thus, a test can be conducted without requiring data actually to be written to memory cells of the memory.

13 Claims, 6 Drawing Sheets

FIG. 3

| | SELECTED CELL | | | UNSELECTED CELL SAME ROW | | | UNSELECTED CELL SAME COLUMN | | |
|---|---|---|---|---|---|---|---|---|---|
| | DRAIN VOLTAGE | GATE VOLTAGE | SOURCE VOLTAGE | DRAIN VOLTAGE | GATE VOLTAGE | SOURCE VOLTAGE | DRAIN VOLTAGE | GATE VOLTAGE | SOURCE VOLTAGE |
| PROGRAM | ~5V | $V_{PP}$ | $V_{GND}$ | $V_{GND}$ | $V_{PP}$ | $V_{GND}$ | ~5V | $V_{GND}$ | $V_{GND}$ |
| ERASE* | FLOATING | $V_{GND}$ | $V_{PP}$ | FLOATING | $V_{GND}$ | $V_{PP}$ | FLOATING | $V_{GND}$ | $V_{PP}$ |
| READ | BIASED TO ~1V | ~5V | $V_{GND}$ | $V_{GND}$ | ~5V | $V_{GND}$ | BIASED TO ~1V | $V_{GND}$ | $V_{GND}$ |

* ALL CELLS SELECTED IN ERASE

# TESTING A NON-VOLATILE MEMORY

FIELD OF THE INVENTION

The present invention relates to testing a non-volatile memory.

BACKGROUND OF THE INVENTION

A non-volatile memory is a memory which stores data without the need for a power supply to maintain the data. One example of a non-volatile memory is an electrically programmable read only memory (EPROM) of which one particular category is a flash EPROM. The time required to program and erase flash EPROMs is long compared with the programming time for volatile memories such as static random access memories (SRAMs) or dynamic random access memories (DRAMs). Moreover, the program and erase operations for a flash memory are destructive, and therefore the number of programming and erase operations which the device can tolerate in its lifetime is limited.

There is a requirement to characterise memory devices in respect of various parameters, one of which is the set-up and hold times for the input of data to the chip. The data falls in three categories: address data required to select particular cells for programming; normal data defining the information to be stored in the memory; and command data which defines the operational mode of the memory. With conventional test methods, the set-up and hold time for the command data can be carried out without affecting the memory cells themselves. The present invention is therefore principally concerned with characterising the set-up and hold time for the normal data and address data. These parameters are currently tested as part of a write/read cycle by writing data bits into the memory at selected addresses and then immediately reading the stored data bits to check their accuracy. The entire cycle time (for writing and reading the data) is determined. This is done by altering the cycle time to the minimum level at which accurate data is still guaranteed. In this method, there is no way of distinguishing between the write time and the read time, since all that can be determined is the overall write and read cycle time. Thus, it is not possible to characterise memories in respect of their set-up and hold times.

Moreover, the existing method requires data actually to be written to memory cells. As explained above, this then reduces the number of cycles for which the part will subsequently operate in normal use. It will readily be appreciated that it is important to characterise the set-up and hold times of the address data and normal data for several different parameters, for example different voltage and temperature parameters. Therefore, many write cycles would be required to carry out a proper characterisation of the memory.

It is an object of the present invention to test a non-volatile memory without requiring data actually to be written to memory cells of the memory.

SUMMARY OF THE INVENTION

According to one aspect of the present invention there is provided an integrated circuit memory device comprising:

a memory array;

a set of data latches for holding data bits to be stored in the memory array;

a plurality of data tracks for supplying data bits to said data latches;

a set of address latches for holding address bits for addressing said memory array;

a plurality of address tracks for supplying address bits to said address latches;

a test bus;

a data bit routing circuit connected to said data latches for selectively routing data bits to one of said array and said test bus;

an address bit routing circuit connected to said address latches for selectively routing address bits to one of said array and said test bus; and output circuitry for outputting data bits and address bits on said test bus whereby said data bits and address bits can be checked for accuracy against data bits and address bits originally supplied via said data tracks and address tracks.

In a particularly advantageous embodiment of the invention, only a subset of the data bits and address bits held in the data latches and address latches respectively are selectively connected to the test bus. The subset of data bits and address bits to be connected to the test bus are selected on the basis of fast and slow data tracks and address tracks. This ensures that the whole spread of track speeds is used to characterise the set-up and hold times.

The invention also provides a method of testing an integrated circuit memory device which comprises a memory array, the method comprising the steps of:

storing data bits in a set of data latches;

storing a set of address bits in a set of address latches;

on selection of a test mode, routing data bits from said data latches and address bits from said address latches to a test bus; and comparing said data bits and address bits on said test bus with the originally supplied data bits and address bits.

The time elapsed between latching the data bits and address bits into the data latches and address latches respectively and outputting them on the test bus can be a relatively relaxed read time and is the time elapsed between an initiation signal and a data read signal. The set-up and hold times for the address bits and data bits can thus be varied to determine when valid bits are no longer output.

The initiation signal can be a chip enable signal or write enable signal. The method of the present invention allows interactions between initiation using the chip enable signal and initiation using the write enable signal to be measured.

The invention has the particular advantage that data does not have to be written to and from the memory array. It also allows the set-up and hold times for the data bits and address bits to be characterised separately from the read time for the memory.

For a better understanding of the present invention and to show how the same may be carried into effect, reference will now be made by way of example to the accompanying drawings.

BRIEF DESCRIPTION OF THE DRAWINGS

FIG. 3 illustrates in tabular form the signals applied to various cells within the flash memory array during operation;

DESCRIPTION OF THE PREFERRED EMBODIMENT

Figure 1:
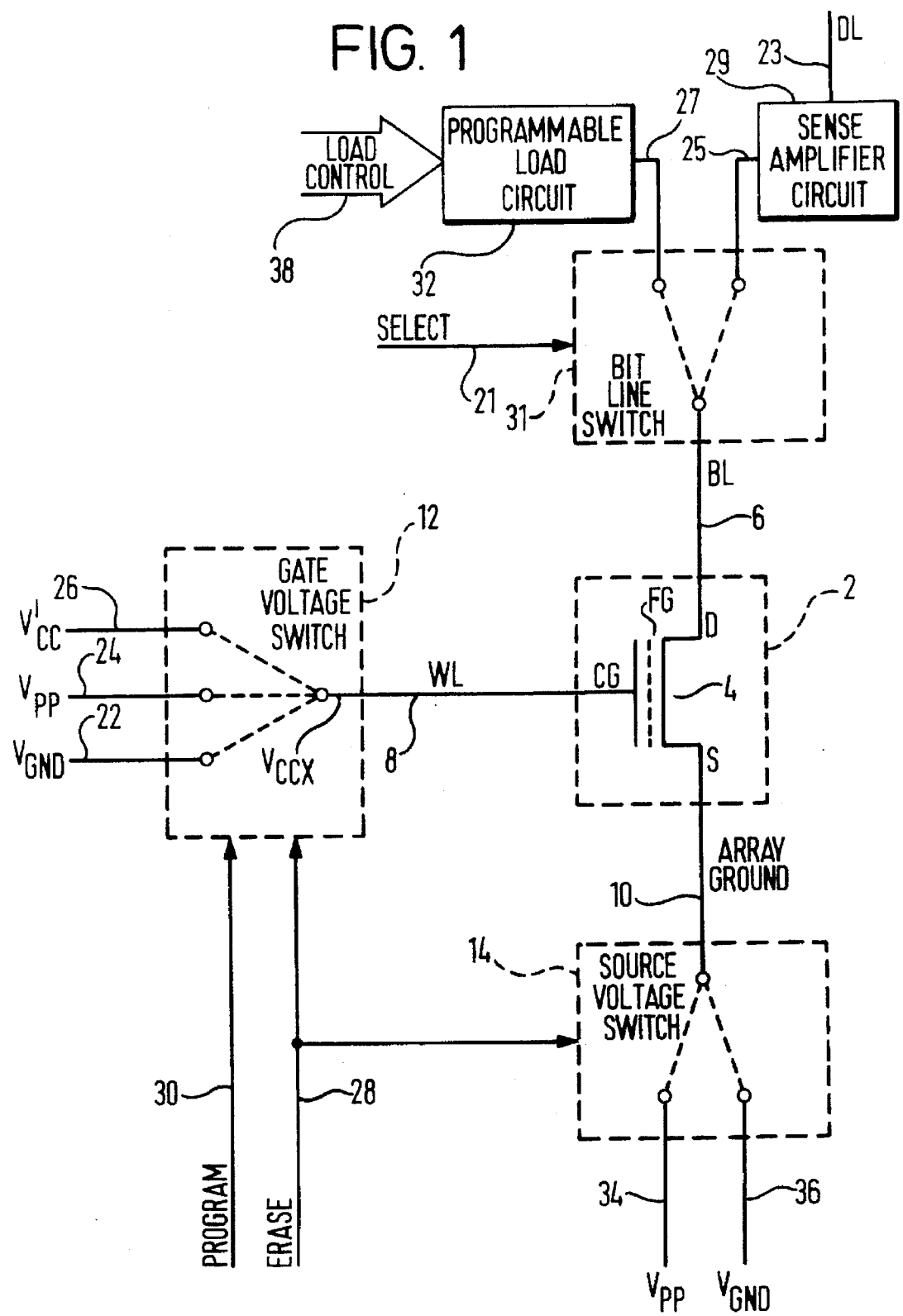
FIG. 1 is an illustrative example of a basic flash memory cell showing the different signal levels which can be applied to the cell.

FIG. 1 illustrates a flash memory cell 2 comprising a single floating gate transistor 4 having a control gate CG, a floating gate FG, a source S, and a drain D. The source S of the floating gate transistor 4 is connected to an ARRAY GROUND signal on line 10. Through a source voltage switch circuit 14 this line 10 can be at a ground voltage VGND or a high voltage Vpp. Voltage Vpp represents a programming potential (typically 12V) and voltage VGND represents device ground. Vpp is normally connected to array ground via a resistor (not shown). The source voltage switch 14 is connected to the voltage Vpp via line 34 and the voltage VGND via line 36. The control gate CG of the floating gate transistor 4 is connected to a gate voltage switch 12 by a word line (WL) 8. The gate voltage switch 12 is further connected to voltages V'cc, Vpp and VGND on lines 26, 24 and 22 respectively. V'cc is at 5V for a 5V part or is boosted to about 5V (or at least above 4V) for a 3V part. These switches 14 and 12 each receive a control signal ERASE on line 28 and additionally the gate voltage switch 12 receives a control signal PROGRAM on line 30. The drain D of the floating gate transistor 4 is connected to a bit line switch 31 by a bit line (BL) 6. The bit line switch is further connected to the input of a programmable load circuit 32 on write line 27 and the input of a sense amplifier circuit 29 on read line 25. It will be appreciated that in an array a plurality b of selected bit lines may simultaneously be connected to the sense amplifier circuit including b amplifiers so that line 25 will be normally implemented as b lines. In the described embodiment b=8. The switch 31 receives a control signal SELECT on line 21. The programmable load circuit 32 receives load control signals on lines 38.

The flash memory has three modes of operation: program, erase and read. Each of these modes will be described hereinafter with reference to FIG. 1. The program mode involves writing a "0" to a memory cell or group of memory cells, the erase mode involves removing a "0" from any cell that has a "0" stored in it such that the cells all effectively store "1"s, and the read mode involves reading a cell to establish whether it is programmed or erased, i.e. contains either a "0" or a "1".

During a program mode, the control signal pROGRAM on line 30 is set such that the gate voltage switch 12 is configured to connect the voltage Vpp on line 24 to the control gate CG of transistor 4 via word line 8. As the control signal ERASE on line 28 is not set the source voltage switch 14 is configured to connect the voltage VGND on line 36 to the source of transistor 4 via the ARRAY GROUND signal line 10. The control signal SELECT on line 21 is set such that the bit line on line 6 is connected to the programmable load 32 by line 27. The load control signals 38 are set such that the programmable load 32 is controlled such that a voltage of about 5V is on the drain D of the transistor 4 via the bit line 6. As a result of these signals applied to the transistor 4 the floating gate FG becomes negatively charged. The negative charge shifts the threshold voltage of the floating gate transistor making it less conductive. The amount of negative charge accumulated at the floating gate depends on the duration for which the control signal PROGRAM is set. In this way, a "0" is written into the cell. Normally, several program pulses are needed, each pulse being followed by a verify cycle.

During an erase mode, the control signal ERASE on line 28 is set such that the gate voltage switch 12 is configured to connect the voltage VGND on line 22 to the control gate CG of the transistor 4 via the word line 8, and such that the switch 14 is configured to connect the voltage Vpp on line 34 to the source S of the transistor 4 via the ARRAY GROUND line 10. The control signal SELECT on line 21 is again set such that the bit line 6 is disconnected so that it floats. As the floating gate transistor is fabricated such that the source region in the substrate underlies the floating gate, any negative charge on the floating gate will be reduced. The amount of negative charge removed from the floating gate FG depends on the duration for which the ERASE signal on line 28 is set. The reduction of negative charge shifts the threshold voltage of the floating gate transistor making it more conductive. In this way the state of the cell is restored to "1". Several erase pulses may be required, each erase pulse being followed by a verify cycle.

During a read mode, neither the control signal ERASE on line 28 nor the control signal PROGRAM on line 30 are set. Consequently, the V'cc signal on line 26 is connected by the source voltage switch 12 to the control gate of the transistor 4 via the word line 8 and the voltage VGND on line 36 is connected to the source of the transistor 4 via the ARRAY GROUND signal line 10. The bit line 6 is biased to approximately 1 volt prior to a read operation by a bit line load (discussed later) within the sense amplifying circuit. During a read operation, for an erased cell (with "1" stored in it) the conductivity of the cell is such that current passes through the cell when the bit line is connected for sensing. For a programmed cell (with a "0" stored in it) substantially no current is passed by the cell. The current passed (or not) by the cell is compared with a reference current to detect the status of the cell, as described in more detail in the following.

The operation of a flash cell in a memory array will now be described with reference to FIG. 2. Signal lines or circuitry common to FIG. 1 can be identified in FIG. 2 by use of the same reference numerals. Voltage supplies have not been illustrated in FIG. 2 for reasons of clarity, but it will be understood with reference to FIG. 1 which voltages are required in various parts of the circuit.

Figure 2:
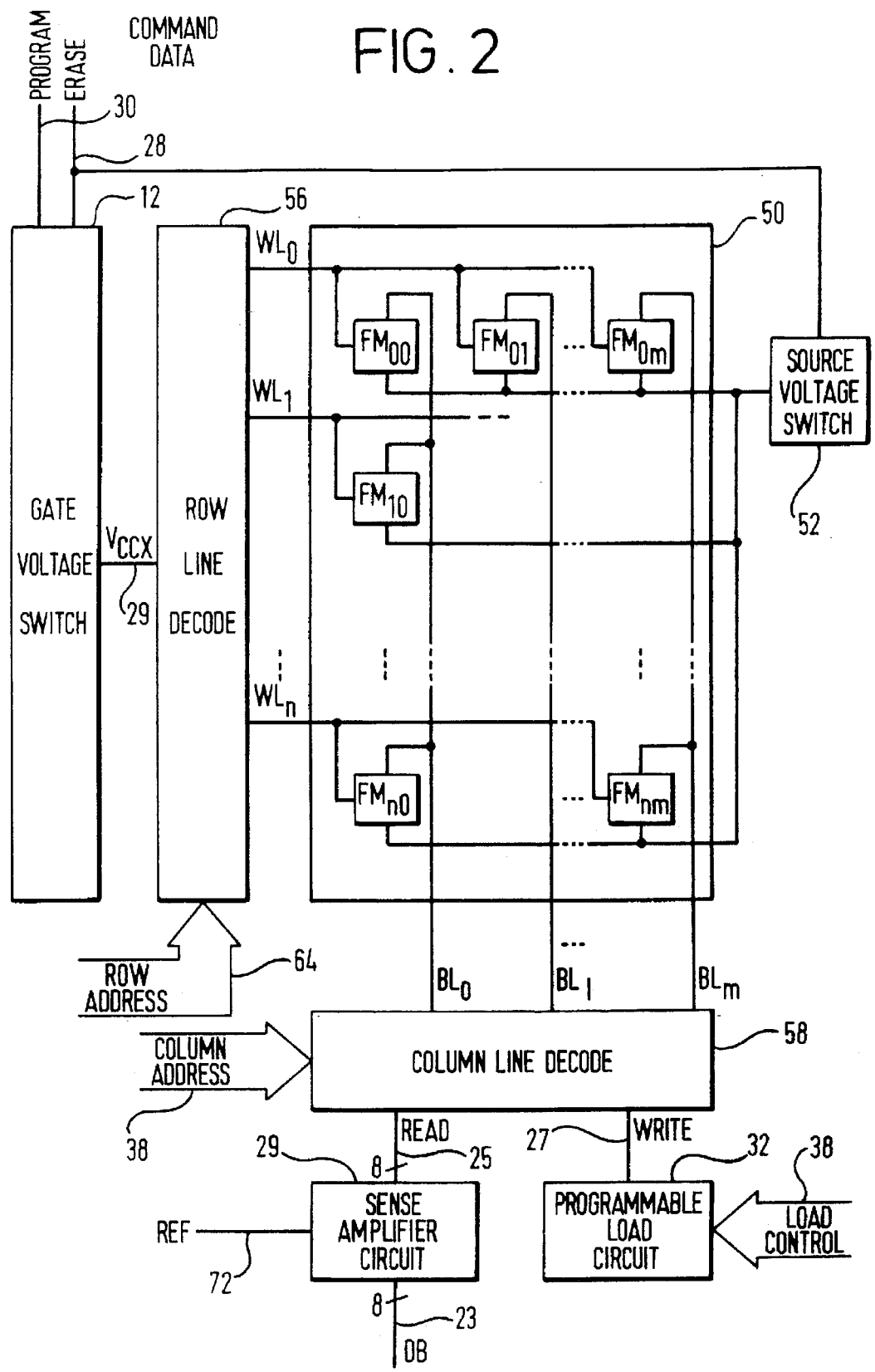
FIG. 2 is an illustrative block diagram of the overall structure of a flash memory array.

FIG. 2 illustrates a flash memory array 50 comprising a plurality of flash memory cells FMoo ... FMnm, arranged in rows and columns, each of which can be the same as the cell 2 shown in FIG. 1. The gates of the transistors in each memory cell in a row are commonly connected to a respective word line WLo ... WLn addressable by a row line decode circuit 56 which receives the row address 64. The gate voltage switch 12 responds to the control signals PROGRAM and ERASE on line 30 and 28 respectively, and supplies the appropriate gate voltage Vccx on line 29 to be switched to the addressed wordline through the row decode circuit 56.

The drains of each transistor in a column are commonly connected by bit lines BLo ... BLm to a column line decode circuit 58. The column line decode circuit can be considered as a plurality b of the bit line switch circuits 31, with the SELECT signal being generated responsive to the column address 38. The output of the column line decode circuit 58 on line 25 is a read output and is connected to the sense amplifier circuit 29. The sense amplifier circuit 29 contains a plurality of sense amplifiers (eight in the described embodiment to allow eight bits to be read in a common cycle) and hence the output on line 25 is actually a plurality of bits wide (eight in the described example). The column line decode circuit receives a write input on line 27 from the programmable load circuit 32. The programmable load circuit is controlled by the load control signals 38. During a program or erase operation the bit lines BLo to BLm are selectively connected to the programmable load circuit 32. During a read operation the selected bit line (or bit lines) are connected to the sense amplifier circuit 29. The sense amplifier circuit 29 also receives a reference signal REF on line 72 and generates output signals on the data bus (DB) 23, which is an eight bit bus in the described embodiment.

It will be appreciated that when a particular cell is chosen to be programmed, the programming load will only be applied to a selected column so that other cells in the same row as the selected cell are not inadvertently programmed. In addition in general during read and program operations it is desirable to apply certain signals to cells in the array which have not been selected to improve the performance of the cell, as is well known in the art. These signals are summarised in FIG. 3. During an erase operation every cell in the memory array is erased, although it will be appreciated by a person skilled in the art that an array could be split into sectors for erasing so that only part of the array is erased at any one time.

Figure 4:
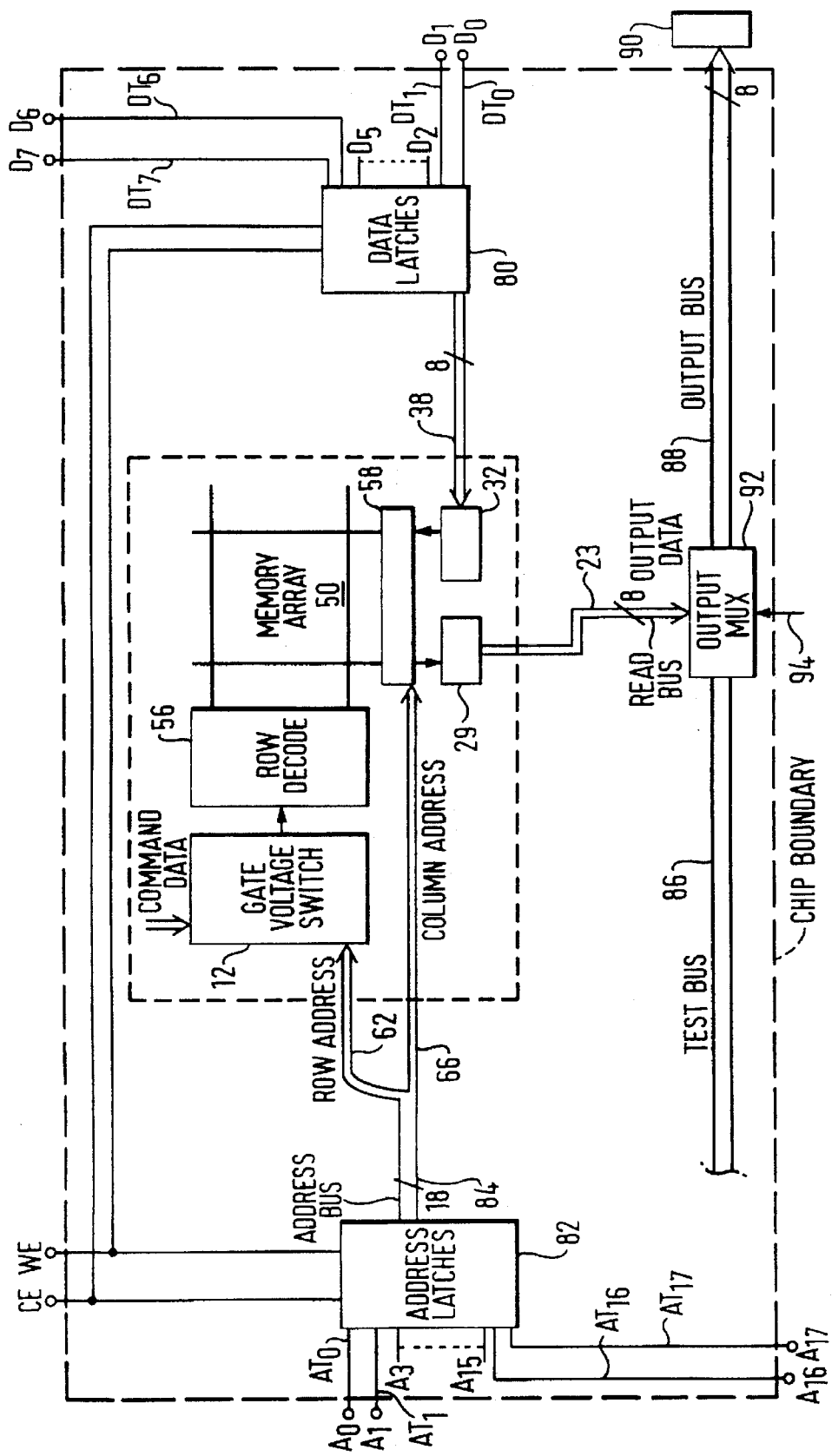
FIG. 4 is a block diagram of a non-volatile memory device without the present invention.

FIG. 4 is a block diagram of a memory chip where the outer broken line denotes the chip boundary. Like numerals denote like parts as in FIG. 1 and 2. Some blocks have been omitted for the sake of clarity. The chip includes a plurality of data input pins $D_0$ to $D_7$ and a plurality of address data inputs pins $A_0$ to $A_{17}$. The data input pins $D_0$ to $D_7$ are each connected to data tracks $DT_0$ to $DT_7$ which supply signals input on the data pins $D_0$ to $D_7$ to a set of respective data latches denoted generally by block 80. Similarly, the address input pins $A_0$ to $A_{17}$ are each connected to address tracks $AT_0$ to $AT_{17}$ which supplies signals input on the address input pins $A_0$ to $A_{17}$ to a set of respective address latches denoted generally by block 82. The data latches 80 supply their data bits along the load control lines 38 to the programmable load circuit indicated by block 32. This determines for each cell selected by the column line decode circuit 58 whether that cell is to be programmed (in which case the bit line is connected to a programming voltage of 5V) or not (in which case the bit line is left floating). The address latches supply the row address on line 62 and column address on line 66 derived from an address bus 84. The address latches are controlled by chip enable CE and write enable WE signals supplied on respective chip enable and write enable pins. The data latches are similarly controlled by the chip enable and write enable signals. The chip includes a test bus 86 and an output bus 88. The output bus is connected to DQ output pads 90 for outputting data read from the memory array 50. It will be appreciated that the DQ input/output pads 90 could also serve as the data input pins $D_0$ to $D_7$, in which case a mode select circuit would be provided to indicate whether or not the pins were acting in an input mode or an output mode. Block 90 is shown here separately from pins $D_0$ to $D_7$ for the sake of convenience. The output bus 88 can be connected either to the read line 23 from the sense amplifiers 29 or to the test bus 86 via an output multiplexor 92 under the control of an output enable OE control signal on line 94.

As is illustrated diagrammatically in FIG. 4, the length of track $DT_0$ to $DT_7$ is different, including some short tracks $DT_0,DT_1$ and some long tracks $DT_6,DT_7$. Similarly, the address tracks $AT_0$ to $AT_{17}$ are of differing lengths. This is to represent different speed of the tracks. Thus, it is well known that on a memory chip there will be some so-called fast tracks and some slow tracks.

In order to characterise the set-up and hold times for normal data and address data of the chip of FIG. 4, normal data is supplied to pins $D_0$ to $D_7$ and address data is supplied to pins $A_0$ to $A_{17}$. On activation of either the chip enable CE or write enable WE signal, the data bits on the pins $D_0$ to $D_7$ are latched into the data latches 80 and the address bits on the pins $A_0$ to $A_{17}$ are latched into the address latches 82. Cells of the memory array 50 are selected under the row address 62 and column address 66 derived from the address data and the data to be written into those cells is determined by the data signals on line 38. The memory array 50 is then read via the sense amplifiers 29. It will be understood from the foregoing that a write operation will normally include one or more program verify cycle intended to verify that writing is complete. The program verify cycle involves reading from the cell being programmed at a voltage higher than a normal read voltage. This program verify step is not to be confused with a conventional array read at a normal read voltage which is used to characterise the set-up and hold time. The entire time taken for the writing (including program verify cycles) and reading is determined at a minimum value at which correct data is sensed. It will be appreciated that the data from the sense amplifiers 29 is output on read line 23 onto the output bus 88 via the output multiplexor 92. The test bus plays no part in characterising the write/read cycle time for the normal data and address data in the chip of FIG. 4. The tester which supplied the data to inputs pins $D_0$ to $D_7$ can then be used to compare that data with the data read out from the memory via DQ pads 90.

Figure 5:
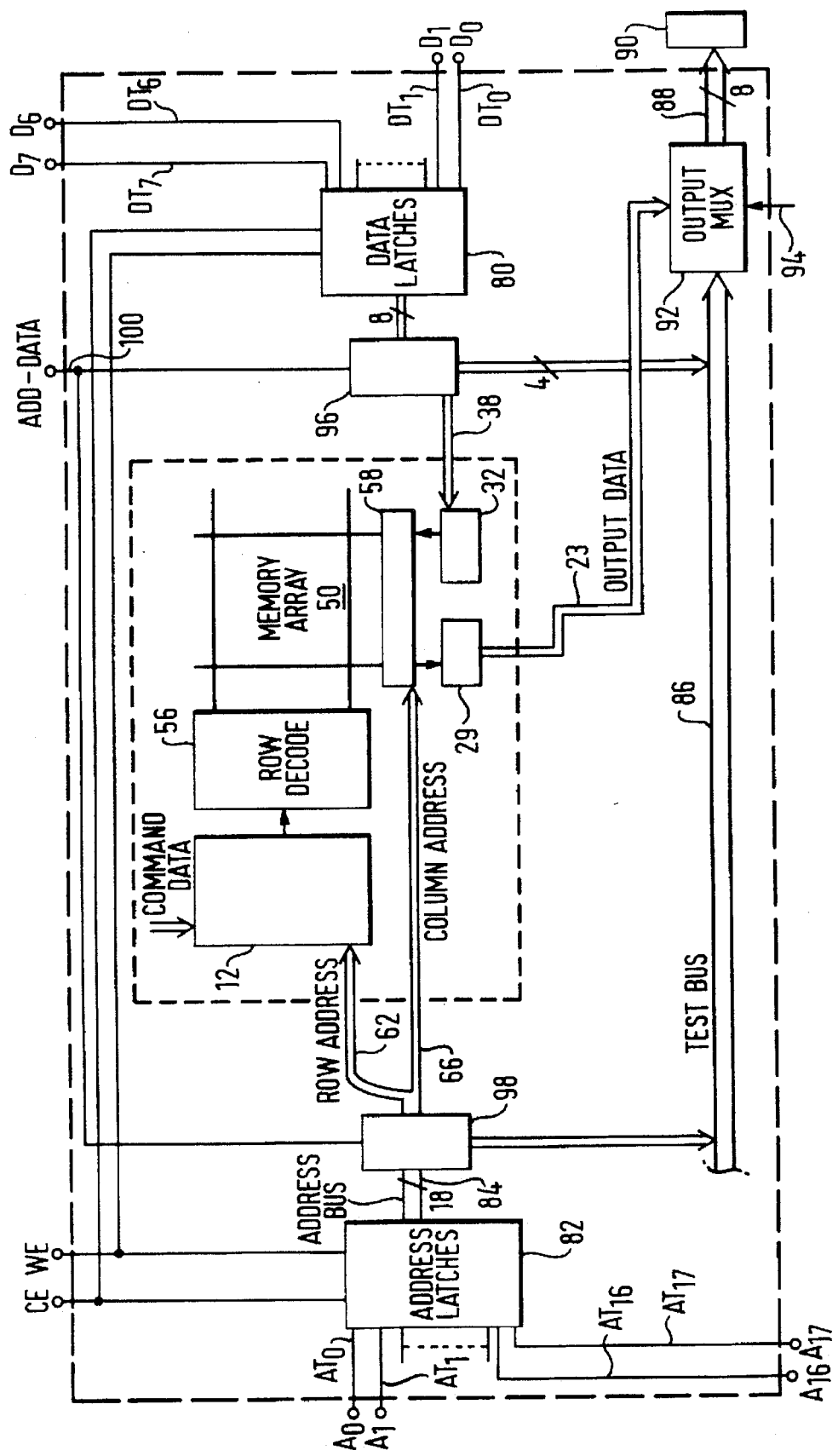
FIG. 5 is a block diagram of a memory device incorporating an embodiment of the present invention.

With the method described above with reference to FIG. 4, it is necessary to physically write data into the memory array 50 and then read it from the memory array 50 in order to determine the cycle time involved. FIG. 5 illustrates a circuit which makes it possible to characterise the set-up and hold times for normal data and address data without physically writing data into the memory array 50. In FIG. 5, like parts are denoted by like numerals as before. Once again, some blocks have been omitted for the sake of clarity. The circuit of FIG. 5 differs from the circuit of FIG. 4 by the provision of first and second multiplexors 96,98. The first multiplexor 96 is connected between the data latches 80 and the programmable load circuit 32. It receives eight bits from the data latches 80 and can be controlled by an ADD-DATA signal on line 100 to supply all eight bits from the data latches 80 via line 38 to the programmable load circuit 32 or to supply four of those eight bits onto the test bus 86. The four bits supplied to the test bus 86 are preferably representative of the fastest and slowest data tracks. Thus, in the embodiment of FIG. 5 they would be taken from data tracks $DT_0,DT_1,DT_6$ and $DT_7$. The second multiplexor 98 is connected between the address bus 84 and the row address and column address lines 62,66. The second multiplexor 98 is also selectively controlled by the ADD-DATA signal on line 100 to either supply the eighteen address bits to the row address line and column address line 62,66 or to supply four of those address bits onto the test bus. Once again, those four address bits are preferably selected as representative of the slowest and fastest address tracks. Thus, in the embodiment of FIG. 5, the four address bits supplied onto the test bus will be derived from the latches associated with the address tracks $AT_0,AT_1,AT_{16},AT_{17}$.

The signal ADD-DATA on line 100 which controls the first and second multiplexors 96,98 can be derived from a pin of the chip or from an internal controller for the chip.

The circuit of FIG. 5 enables a special test mode to be used to characterise the set-up and hold times for normal data and address data. Normal data bits and address data bits are supplied by a tester onto data pins $D_0$ to $D_7$ and address pins $A_0$ to $A_{17}$. The test sequence is initiated by setting the ADD-DATA signal on line 100 and the normal data bits and address data bits are latched respectively into the data latches 80 and address latches 82 under the control of the write enable signal WE. The four selected data bits from data latches 80 and four selected address bits from address latches 82 are supplied to the test bus 86. The output multiplexor 92 is controlled by the OE signal on line 94 to connect the test bus 86 onto the read bus 88 for outputting the data. The cycle time for the test between the write enable signal and output enable signal is a relaxed "read" cycle time. The bits output on the output bus 88 via DQ pads 90 is compared with the originally supplied normal data bits and normal address bits.

This special test method allows the set-up and hold times for the normal data and address data to be characterised without the need to write to the memory array 50. Moreover the set-up and hold times can be characterised separately from the read times. This allows the address and data tracks and address and data latches to be tested separately from the array. This has several advantages. Firstly, it then becomes possible to test interrelationships between set-up and hold times responsive to the chip enable signal CE and set-up and hold times responsive to the write enable signal WE. This has normally not been done in the past because it would require yet more write cycles to be performed on the memory array. Furthermore, it means that the memory array itself can be tested using looser time parameters, because it can be tested without a need for critical timing for the write and read cycle. Furthermore, the special test can be completed in a short time of about 200 microseconds per test point.

With the special test mode of the invention it becomes possible to separate parts on the basis of their set-up and hold times. This was not possible with the conventional test mode, because the test was difficult to carry out, destructive of the memory and time consuming.

It has been established that it is quite adequate to select only some of the normal data bits and address data bits representative of the fastest and slowest paths for subsequent comparison. It would be possible to carry out the test and to output all of the data bits and address bits which had been input, but this would increase the width of the buses from the first and second multiplexors 96,98.

Figure 6:
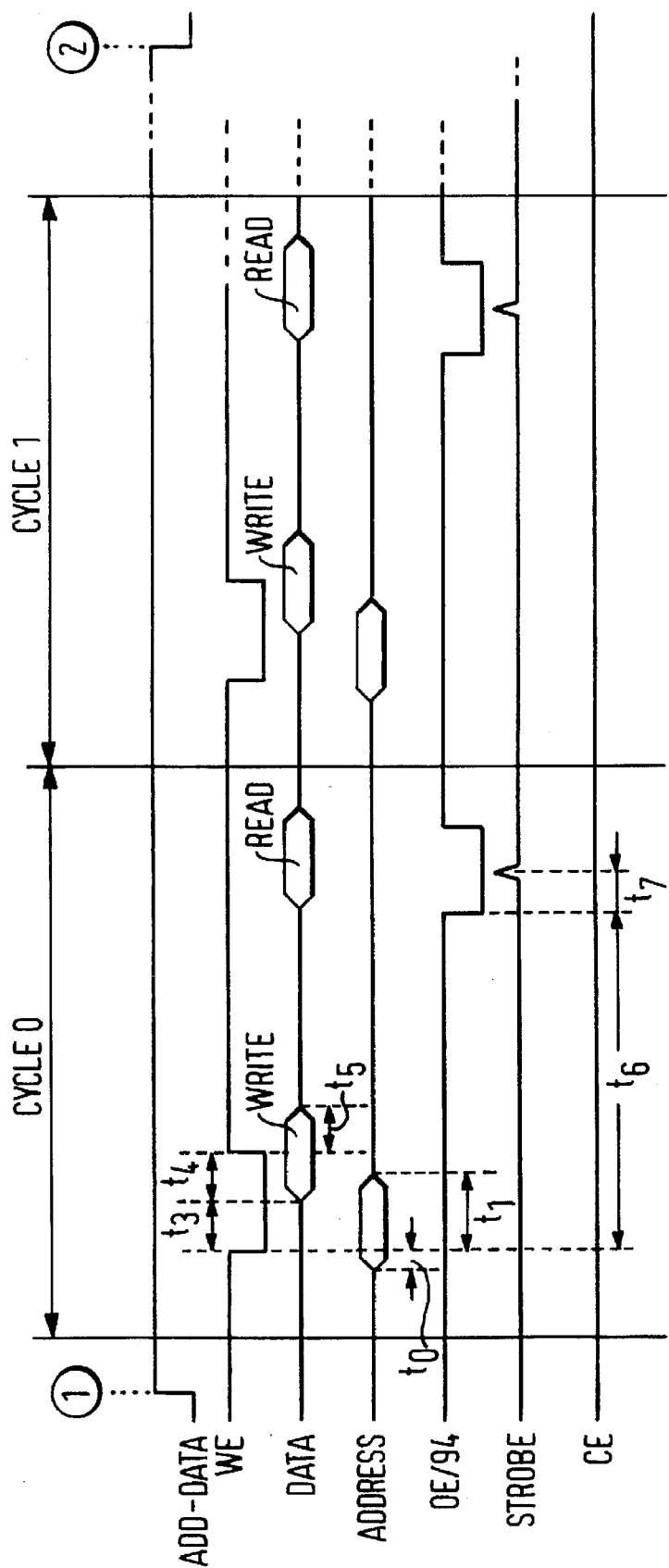
FIG. 6 is a timing diagram for the test mode of the invention.

Reference will now be made to FIG. 6 to describe operation in the test mode. At point 1 in FIG. 6, the test mode is entered by the ADD-DATA signal going high. As explained above this can be done in one of a plurality of ways.

Address bits are then placed on address pins A0,A1,A16, A17 as shown on the line marked ADDRESS in FIG. 6. At a time $t_o$ thereafter, the write enable signal WE goes low which causes the address bits on address pins A0,A1,A16, A17 to be latched into the address latches 82. Time $t_o$ represents the set-up time from the address signal going valid to the write enable signal WE going low. Time $t_1$ represents the time for which the address signal remains valid after the write enable signal WE has gone low and thus represents the address hold time.

At a time $t_3$ after the write enable signal WE going low, data bits are placed on the data pins D0,D1,D6,D7. At a time $t_4$ thereafter, the write enable signal WE goes high and causes the data bits on the data pins to be latched into the data latches 80. Time $t_4$ thus represents the set-up time for which the data is valid prior to setting the write enable signal high. The data signal remains valid for a time $t_5$ thereafter, which represents the data hold time.

At some time $t_6$ after the write enable signal WE going low, the output enable signal OE on line 94 goes low. The time $t_6$ is a relatively relaxed read cycle time, selected to make sure that the write enable signal has changed its state before output enable goes low. OE going low causes the output multiplexor 96 to connect the test bus to the output bus 88 and thereby to supply the data bits and address bits onto the output pads 90. This is indicated diagrammatically by the section marked READ in FIG. 6 on the data line. A strobe signal at time $t_7$ after the output enable signal goes low samples the data and address bits on the output pins 90 to check whether or not the bits are valid. It will be appreciated that the part marked READ on the data line involves reading the data bits which were input on pins D0,D1,D6 and D7 and also the address bits which were input on pins A0,A1,A16 and A17 and which have been connected to the test bus from the address latches 82. These test bits are compared with the bits originally supplied for the test. The set-up and hold times for the data and address bits ($t_o, t_1, t_4, t_5$) can now be varied to determine under what conditions valid data is no longer present.

The test mode can be implemented over a plurality of cycles. As eight bits are tested (four data bits and four address bits), it is particularly convenient to use 256 cycles using an eight bit code for 0,1,2 ... 255 represented by bits on pins D0,D1,D6,D7,A0,A1,A16,A17. Thus, FIG. 6 shows CYCLE 0 and CYCLE 1. At the end of CYCLE 255, at point 2 in FIG. 6, the ADD-DATA signal is taken low to exit the test mode.

The above description has been given in relation to a test mode characterising the set-up and hold times with respect to the write enable signal. It is possible to carry out the test mode with respect to the chip enable signal, in which case the write enable signal would be held low and the chip enable signal would be set high to latch the address and data bits.

In FIG. 6, the address bits are shown as being latched on the falling edge of the write enable signal and the data bits are shown as being latched on the rising edge of the write enable signal. It will readily be appreciated however that an alternative arrangement could be used in which the data bits are latched on the falling edge of the write enable signal and the address bits are latched on the rising edge of the write enable signal or a still further alternative in which they are both latched on either the rising or falling edge.

What is claimed is:

1. An integrated circuit memory device comprising: a memory array;

a set of data latches for holding data bits to be stored in the memory array;

a plurality of data tracks for supplying data bits to said data latches;

a set of address latches for holding address bits for addressing said memory array;

a plurality of address tracks for supplying address bits to said address latches;

a test bus;

a data bit routing circuit connected to said data latches for selectively routing data bits to one of said array and said test bus;

an address bit routing circuit connected to said address latches for selectively routing address bits to one of said array and said test bus; and output circuitry for outputting data bits and address bits on said test bus whereby said data bits and address bits can be checked for accuracy against data bits and address bits originally supplied via said data tracks and address tracks.

2. An integrated circuit memory device according to claim 1 wherein said data bit routing circuit is connected to selectively supply only a subset of said data bits from said data latches to said test bus, said subset being selected from at least one fast and one slow data track.

3. An integrated circuit memory device according to claim 1 or 2 wherein the address bit routing circuit is connected to supply only a subset of said address bits selectively to said test bus, said subset being selected from at least one fast and one slow address track.

4. An integrated circuit memory device according to claim 2 or 3 wherein four data bits and four address bits are selectively routed to said test bus.

5. An integrated circuit memory device according to claim 1 which includes addressing circuitry connected to receive said address bits and to address said memory array.

6. An integrated circuit memory device according to claim 1 which includes programming circuitry connected to receive said data bits and to program said memory array in accordance with said data bits at selected addresses.

7. An integrated circuit memory device according to claim 1 which includes sensing circuitry for reading data bits stored in said memory array.

8. An integrated circuit memory device according to claim 7 wherein said sense circuitry is connected to an output data bus for supplying data bits read from said memory array off chip.

9. An integrated circuit memory device according to claim 8 which includes an output switch for selectively connecting said output data bus and said test bus to output pads of the chip.

10. An integrated circuit memory device according to claim 1 wherein said memory array includes a plurality of single transistor floating gate memory cells.

11. A method of testing an integrated circuit memory device which comprises a memory array, the method comprising the steps of:

storing data bits in a set of data latches;

storing a set of address bits in a set of address latches;

on selection of a test mode, routing data bits from said data latches and address bits from said address latches to a test bus; and comparing said data bits and address bits on said test bus with the originally supplied data bits and address bits.

12. A method according to claim 11 wherein a subset of said data bits supplied to said data latches is connected to said test bus on selection of said test mode.

13. A method according to claim 11 or 12 wherein a subset of said address bits supplied to said address latches is connected to said test bus in said test mode.

* * * * *